(12) United States Patent
Ahn et al.

(10) Patent No.: US 9,378,919 B2
(45) Date of Patent: Jun. 28, 2016

(54) BONDING APPARATUS AND METHOD FOR MANUFACTURING DISPLAY DEVICE USING THE SAME

(71) Applicant: Samsung Display Co., Ltd., Yongin (KR)

(72) Inventors: Kyung Hyun Ahn, Yongin-si (KR); Jin Han Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/667,381

(22) Filed: Mar. 24, 2015

(65) Prior Publication Data

US 2016/0126049 A1    May 5, 2016

(30) Foreign Application Priority Data

Oct. 29, 2014    (KR) .......................... 10-2014-0148128

(51) Int. Cl.
*H01J 9/00*    (2006.01)
*H01J 9/20*    (2006.01)

(52) U.S. Cl.
CPC ........................................ *H01J 9/20* (2013.01)

(58) Field of Classification Search
CPC ........................................................ H01J 9/20
USPC ...................................................... 445/23–25
See application file for complete search history.

(56) References Cited

U.S. PATENT DOCUMENTS

2012/0110166 A1    5/2012    Shin et al.

FOREIGN PATENT DOCUMENTS

| JP | 2004-358856 | 12/2004 |
| KR | 10-2006-0002297 | 1/2006 |
| KR | 10-2013-0142020 | 12/2013 |
| KR | 10-2014-0000495 | 1/2014 |
| KR | 10-1407057 | 6/2014 |

*Primary Examiner* — Joseph L Williams
(74) *Attorney, Agent, or Firm* — H.C. Park & Associates, PLC

(57) ABSTRACT

A bonding apparatus bonds one member to another member by using the pressure difference between the pressure between the two members and the ambient pressure. After aligning two members close to each other on a chuck and a supporting member in a vacuum chamber, the chamber is vacuumed to form vacuum between the two members. Then, air is supplied to the vacuum chamber to increase the ambient pressure to normal. The increased ambient pressure pushes the one member on the supporting member to the other member on the chuck, bonding both members together.

20 Claims, 22 Drawing Sheets

BONDING APPARATUS AND METHOD FOR MANUFACTURING DISPLAY DEVICE USING THE SAME

CROSS REFERENCE TO RELATED APPLICATIONS

This application claims priority from and the benefit of Korean Patent Application No. 10-2014-0148128, filed on Oct. 29, 2014, which is hereby incorporated by reference for all purposes as if fully set forth herein.

BACKGROUND

1. Field of the Invention

The present invention relates to a bonding apparatus and a method for manufacturing a display device using the same.

2. Discussion of the Background

Various kinds of display devices, such as an organic light emitting display device and a liquid crystal display device, have been used in a computer, a portable terminal, and monitors of various kinds of information devices.

Such a display device may include a panel member, such as a display panel, for displaying an image and an optical member, such as an optical film, bonded to the display panel in an image emission direction to perform an optical function. The optical member may include an adhesive layer to be bonded to the panel member.

Conventionally, the optical member is bonded to the panel member by pressing using a roller or a drum.

SUMMARY

Exemplary embodiments of the present invention provide a method for manufacturing a display device, comprising arranging a movement portion of a support member connected to a contact portion of the support member and horizontally and vertically movable, on a side portion of a chuck arranged in an inner space of a chamber such that the contact portion of the support member overlaps an edge portion of a panel member seated on the chuck, attaching an edge portion of an optical member facing the panel member to the contact portion. Exemplary embodiments also provide forming a first pressure, and making the contact portion contact with the edge portion of the panel member through vertically moving the movement portion, forming a second pressure that is higher than the first pressure, and making the panel member and the optical member come in contact with each other due to a difference between the second pressure on the outside of the optical member and the first pressure between the optical member and the panel member, and detaching the contact portion from the edge portion of the panel member and the edge portion of the optical member through horizontally moving the movement portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate exemplary embodiments of the invention, and together with the description serve to explain the principles of the invention.

DETAILED DESCRIPTION OF THE EMBODIMENTS

Figure 1:
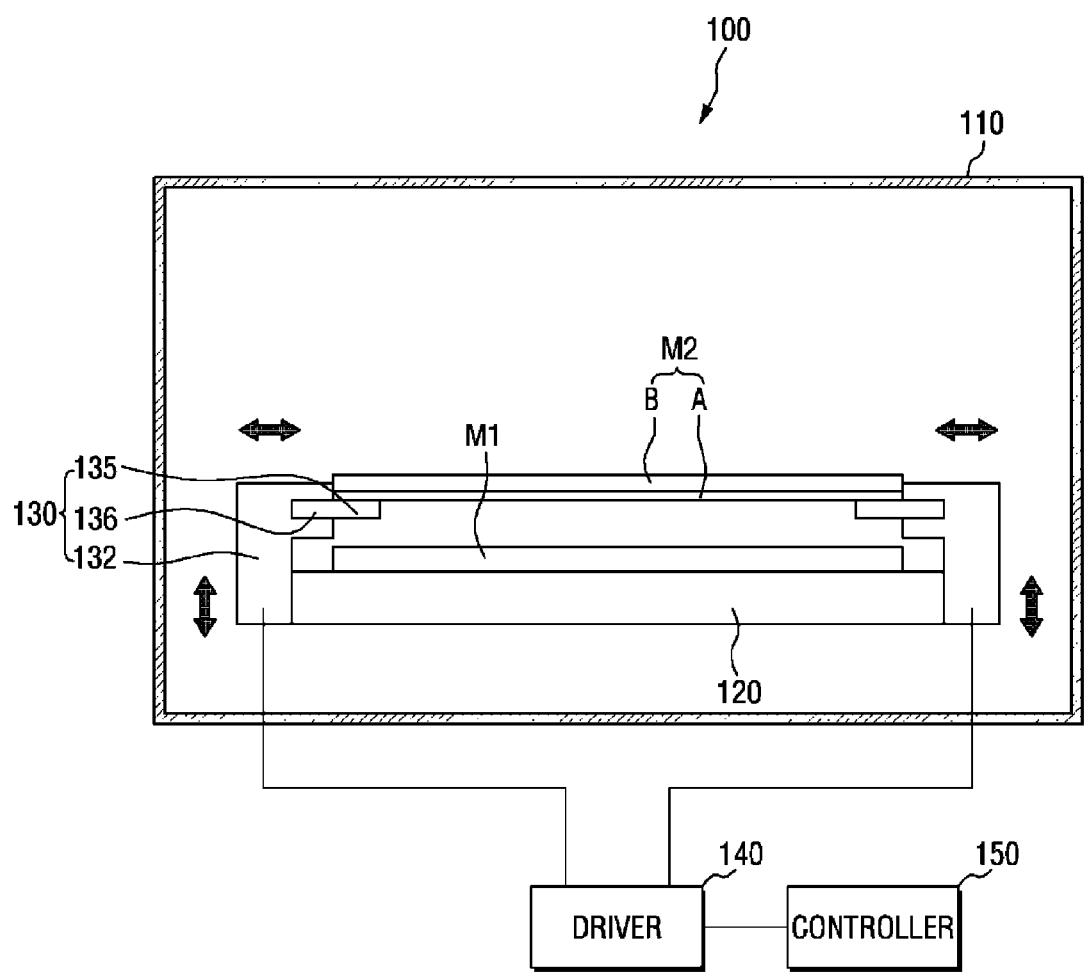
FIG. 1 is a cross-sectional view of a bonding apparatus according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, preferred embodiments of the present invention will be described in detail with reference to the accompanying drawings.

Figure 2:
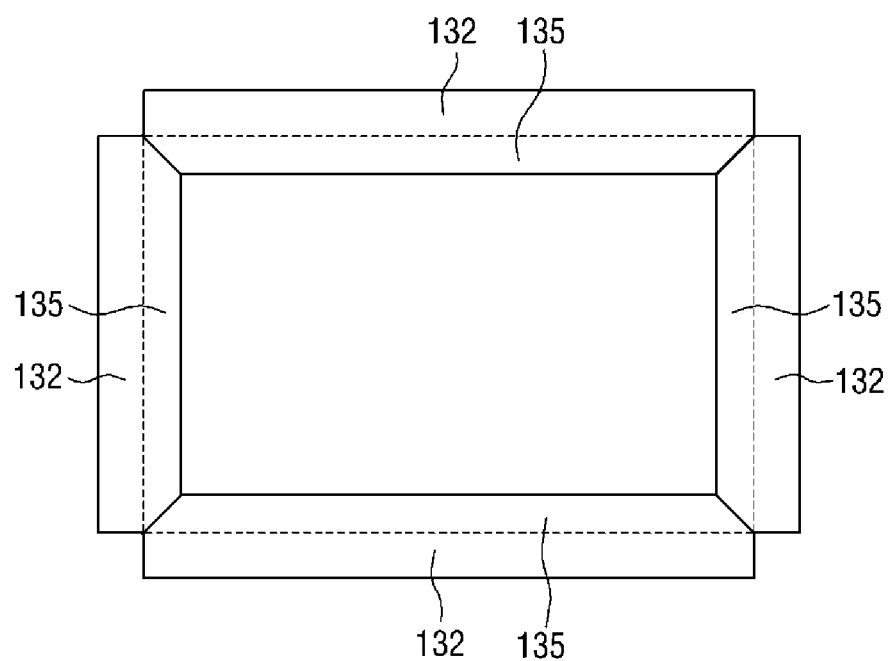
FIG. 2 is a plan view of a support member according to exemplary embodiments of the present invention.

FIG. 1 is a cross-sectional view of a bonding apparatus according to an embodiment of the present invention, and FIG. 2 is a plan view of a support member.

Referring to FIG. 1, a bonding apparatus may 100 include a chamber 110, a chuck 120, and a plurality of support members 130. The bonding apparatus 100 may bond a panel member M1 and an optical member M2 using the plurality of support members 130.

The chamber 110 may be formed to have an inner space. Although not illustrated, on one side of the chamber 110, a gateway may be formed so that the panel member M1 and the optical member M2 may be drawn into or out of the inner space of the chamber 110 through the gateway. A vacuum pump for discharging air may be connected to the other side of the chamber 110 to make the inner space of the chamber 110 in a vacuum state. When the inner space of the chamber 110 is in a vacuum state, a first pressure may be formed in the inner space of the chamber 110. A vent means for air injection may be connected to a region of a side portion of the chamber 110 except for a region of the side portion where the gateway and the vacuum pump may be installed to make the inner space of the chamber 110 in an atmospheric state. When the inner space of the chamber 110 is in an atmospheric state, a second pressure that is higher than the first pressure may be formed in the inner space of the chamber 110.

The chuck 120 may be arranged on a bottom side of the inner space of the chamber 110 to provide a space where the panel member M1 may be seated. The chuck 120 may be a vacuum chuck that may be configured to fix the panel member M1 using vacuum adsorption or an electrostatic chuck that may be configured to fix the panel member M1 using an electrostatic force.

The panel member M1 may include a substrate for a display, such as an organic light emitting display device or a liquid crystal display device. The substrate for a display may be a bare substrate or a substrate in which switching elements are formed. In the case of the organic light emitting display device, the substrate for a display may be a substrate in which switching elements and a light emitting layer are formed.

The panel member M1 may be a display panel that may include two substrates which may be bonded through the medium of a light emitting layer or a liquid crystal layer. The substrate may be a glass substrate or a flexible substrate that is formed of plastic, for example, polyethyleneterephthalate, polyethylenenaphthalate, polycarbonate, polyarylate, polyetherimide, polyethersulfone, or polyimide. The flexible substrate may be provided as a flexible film.

The plurality of support members 130 may be installed in the inner space of the chamber 110. The plurality of support members 130 may support the optical member M2 that is drawn into the inner space of the chamber 110, and may adjust the tension of the optical member M2 so that the optical member M2 does not droop downward.

The optical member M2 may be a film having an optical function. For example, in the case where the panel member M1 of the display device is a substrate for a display in which switching elements are formed, the optical member M2 may be a protection film that protects the panel member M1. The protection film may be temporarily attached to the panel member M1 in the process of manufacturing a display device, and is separated from the panel member M1 in the completed display device. In the case where the panel member M1 is a substrate for a display in which switching elements and a light emitting layer are formed, the optical member M2 may be an encapsulation film that encapsulates the switching elements and the light emitting layer. In the case where the panel member M1 is a display panel that includes two substrates which are bonded through the medium of the light emitting layer or the liquid crystal layer, the optical member M2 may be a polarizing film or an OCA (Optical Clear Adhesive) film. The optical member M2 may include a base film layer B that is formed of polyimide or polyethyleneterephthalate and an adhesive layer A that is formed of thermosetting resin, such as acrylic resin, on the base film layer B. The base film layer B may further include configurations for implementing the optical function.

Each of the plurality of support members 130 may include a movement portion 132 and a contact portion 135. The support member 130 may further include a connection portion 136.

Figure 25:
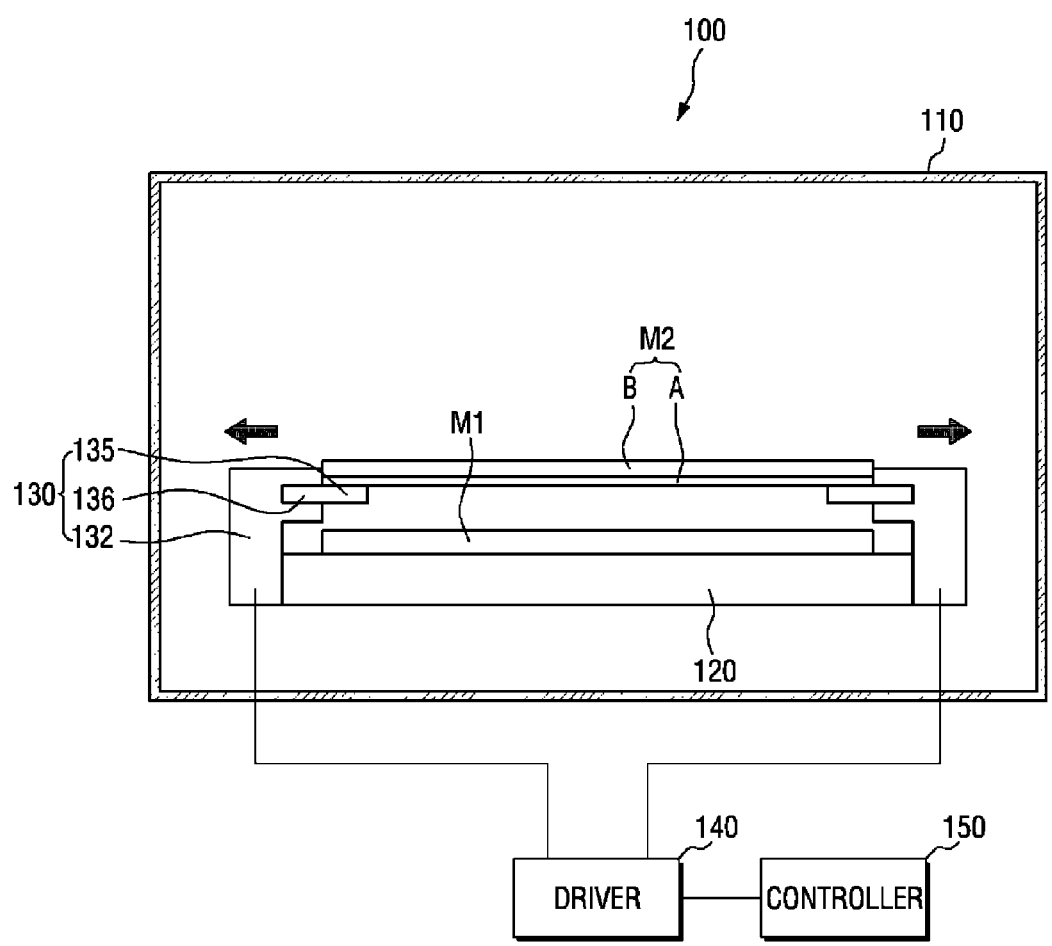
Figure 26:
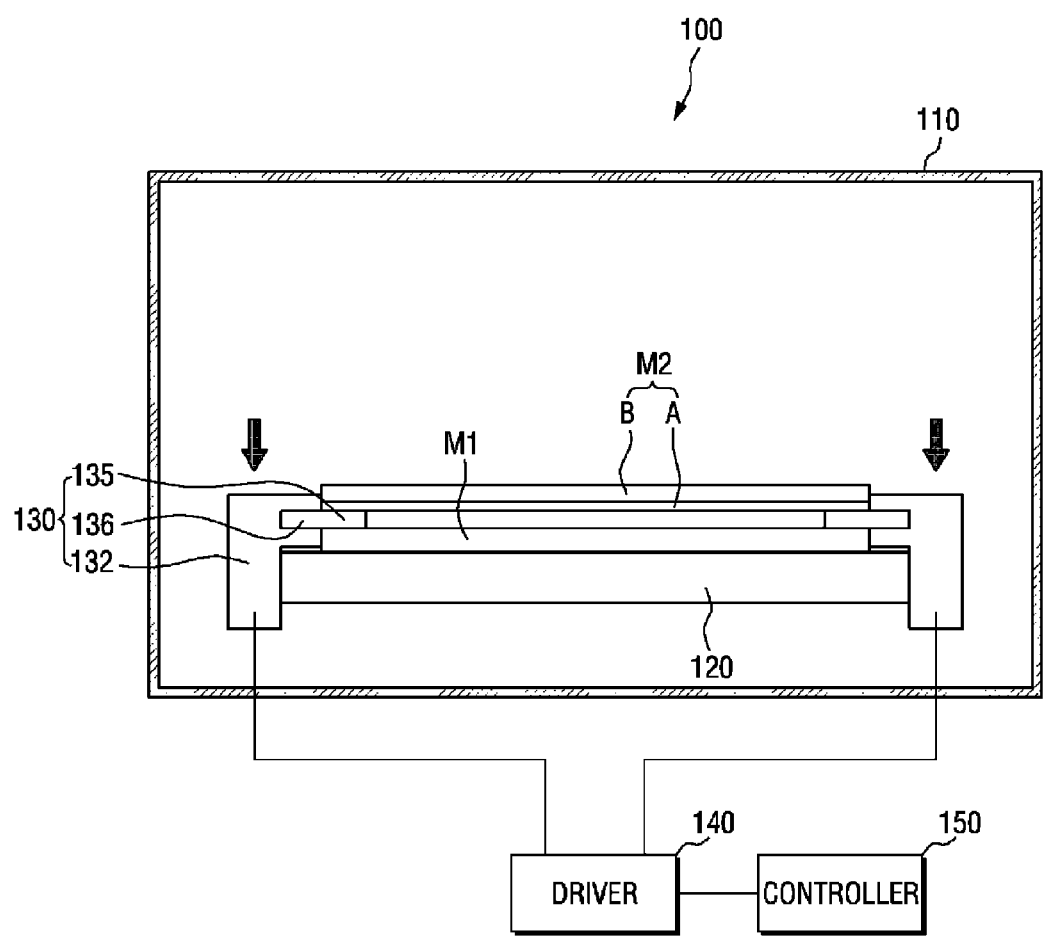
Figure 27:
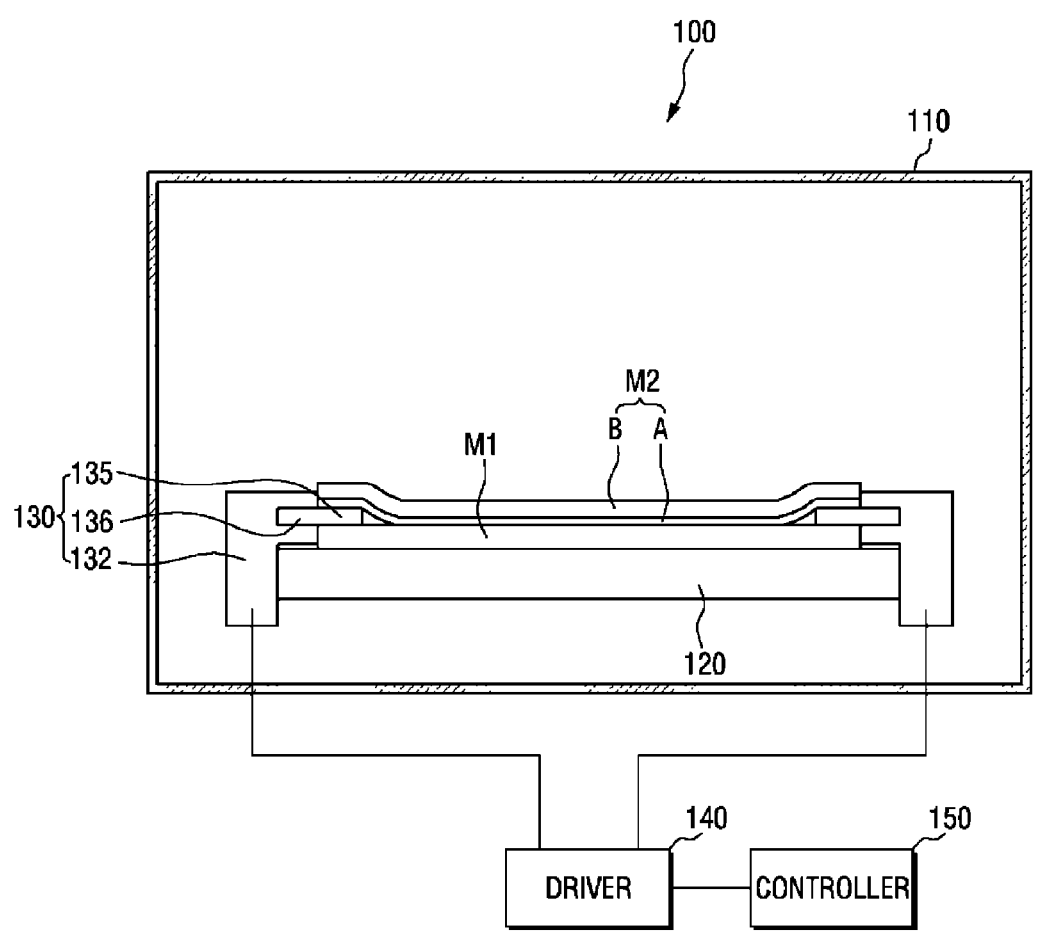

The movement portion 132 may perform vertical movement to make the contact portion 135, to which an edge portion of the optical member M2 may be attached, may come in contact with an edge portion of the panel member M1, and an edge portion of the panel member may come in contact with each other, and may move the optical member M2 close to the side of the panel member M1 before the optical member M2 starts to come in close contact with the panel member M1 due to a difference between the second pressure on the outside of the optical member M2 and the first pressure that is formed between the optical member M2 and the panel member M1 (see FIGS. 26 and 27). As described above, the first pressure may be a pressure in a vacuum state that may be formed through discharging air out of the inner space of the chamber 110 before the contact portion 135 comes in contact with the edge portion of the panel member M1. As described above, the second pressure may be a pressure in an atmospheric state that may be formed through injecting air into the inner space of the chamber 110 using the vent means. The second pressure may be higher than the first pressure, and may be formed after the contact portion 135 comes in contact with the edge portion of the panel member M1. Accordingly, after the contact portion 135 comes in contact with the edge portion of the panel member M1, the pressure between the optical member M2 and the panel member M1 may become the first pressure, and the pressure outside the optical member M2 may become the second pressure. The movement portion 132 may move horizontally to adjust a tension of the optical member M2 of which the edge portion may be attached to the contact portion 135, and thus may prevent the optical member M2 from drooping downward (see FIG. 25). The movement portion 132 may perform horizontal movement so as to detach the contact portion 135 that may be interposed between the edge portion of the panel member M1 and the edge portion of the optical member M2 when the panel member M1 and the optical member M2 come in close contact with each other (see FIG. 28).

The movement portion 132 may be formed in a "⌐" shape, but is not limited thereto. The movement portion 132 may be made of a stainless steel material which is durable enough to withstand a small amount of particles, but is not limited thereto.

The contact portion 135 may be connected to the movement portion 132 to provide a space in which the edge portion of the optical member M2 that is arranged on the upper portion of the panel member M1 may be substantially attached. For example, the edge portion of the adhesive layer A of the optical member M2 may be attached to the contact portion 135.

The contact portion 135 may be formed of a material that does not generate static electricity with the adhesive layer A. This may prevent internal elements of the panel member M1 from being damaged by static electricity that the touch of the contact portion 135 with the adhesive layer A of the optical member M2 may generate. For example, when the adhesive layer A of the optical member M2 is formed of acrylic resin, the contact portion 135 may be formed of a silicon or Teflon™ material.

The connection portion may be integrally formed with the contact portion 135, and may be coupled to the movement portion 132. The coupling of the connection portion 136 to the movement portion 132 may be performed using, for example, a bolt, but the engagement means is not limited thereto.

On the other hand, in the case where the optical member M2 is in a rectangular shape, the plurality of support members 130 may be divided along sides of the optical member M2 as illustrated in FIG. 2, and may correspond to the sides of the optical member M2. The movement portions 132 of the support members 130 may be independently driven, and the contact portions 135 may be formed with a width that becomes narrower in a direction from an outside to an inside of the chuck 120 as illustrated in FIG. 2 so that the contact portions 135 may not interfere with the movement portions 132 when the movement portion 132 performs horizontal movement.

A driver 140 may be connected to the movement portion 132 of the support member 130, and may include a driving device, such as a motor, to drive the movement portion 132.

A controller 150 may control the driver 140 to enable the movement portion 132 to perform vertical movement and horizontal movement. The controller 150 may control the overall processes for bonding the panel member M1 and the optical member M2 to each other. For example, the controller 150 may control a process of fixing the panel member M1 to the chuck 120, a process of drawing the optical member M2 into or out of the inner space of the chamber 110, and a process of making the inner space of the chamber 110 in a vacuum state or in an atmospheric state.

As described above, according to the bonding apparatus 100, the optical member M2 and the panel member M1 may be bonded by making the optical member M2 and the panel member M1 come in close contact with each other due to the difference between the second pressure on the outside of the optical member M2 and the first pressure between the optical member M2 and the panel member M1, rather than the pressing method using a roller or a drum, using the plurality of support members 130 each of which may include the movement portion 132 that may perform the horizontal movement and the vertical movement and the contact portion 135 to which the edge of the optical member M2 may be attached.

According to the bonding apparatus 100 of the exemplary embodiment, the problems of the chopping inferiority, bubbles, wrinkles, detachment phenomenon, and contact inferiority that may occur on the optical member M2 and the panel member M1 may be reduced when bonding the optical member M2 and the panel member M1.

According to the bonding apparatus 100, the deterioration of the display quality of the display device that is manufactured by the bonding of the optical member M2 and the panel member M1 may be reduced.

Various examples of the support member will be described.

FIGS. 3 through 22 are cross-sectional views and plan views illustrating various examples of a support member.

Figure 3:
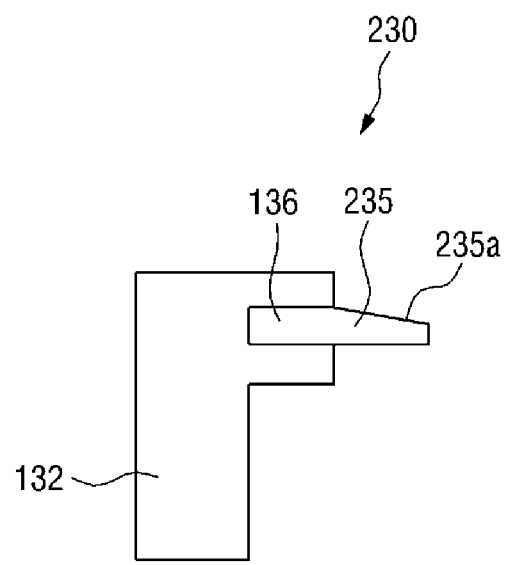
FIGS. 3 through 22 are cross-sectional views and plan views illustrating various examples of a support member according to exemplary embodiments of the present invention.
Figure 4:
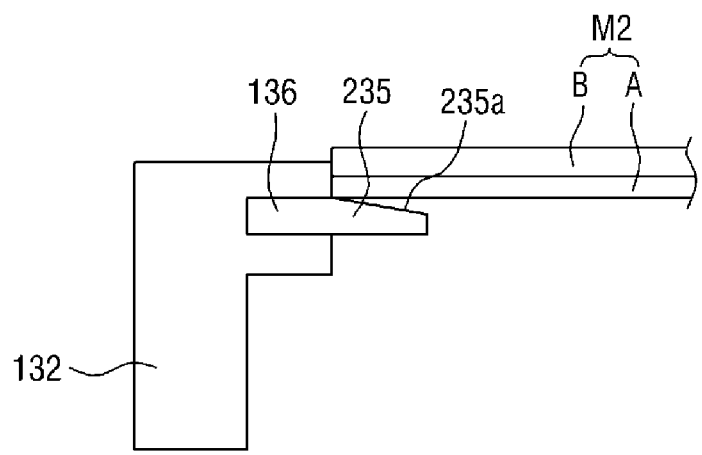

FIG. 3 illustrates that a support member 230 may include a movement portion 132, a contact portion 235, and a connection portion 136, and the thickness of the contact portion 235 may become thinner as going from the outside to the inside of the chuck 120 shown in FIG. 1. The upper surface 235a of the contact portion 235 may be an inclined flat surface. As illustrated in FIG. 4, by reducing the attachment area between the contact portion 235 and the optical member M2, the support member 230 may facilitate the detachment of the contact portion 235 when the optical member M2 and the panel member M1 come in close contact with each other to be bonded together due to the difference between the second pressure on the outside of the optical member M2 and the first pressure between the optical member M2 and the panel member M1.

Figure 5:
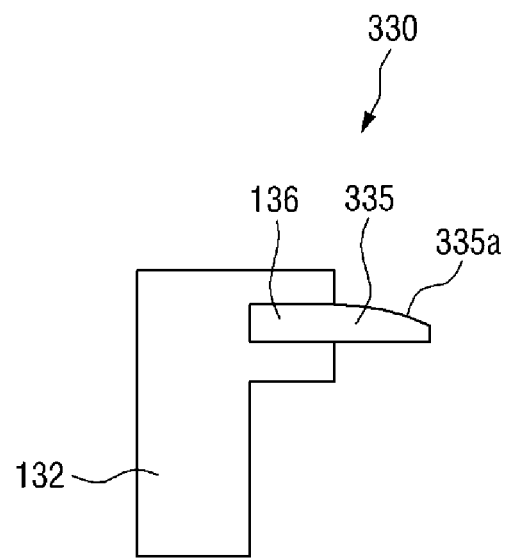
Figure 6:
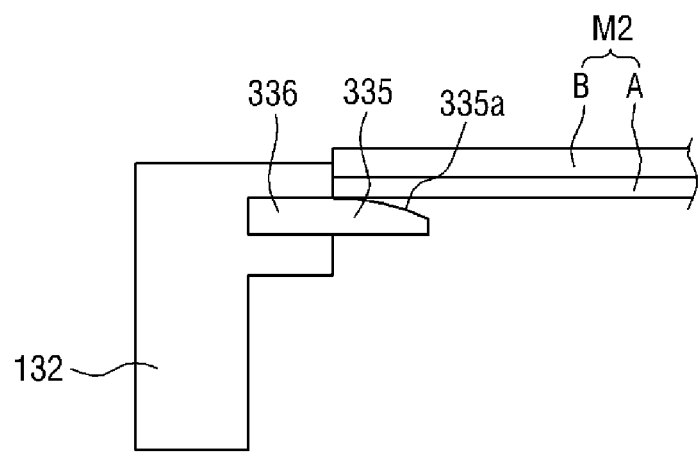

FIG. 5 illustrates that a support member 330 may include a movement portion 132, a contact portion 335, and a connection portion 136, and the thickness of the contact portion 335 may become thinner as going from the outside to the inside of the chuck 120 shown in FIG. 1. The upper surface 335a of the contact portion 335 may be a curved surface that may be inclined and may be upwardly convex. As illustrated in FIG. 6, by reducing the attachment area between the contact portion 335 and the optical member M2, the support member 330 may facilitate and smooth the detachment of the contact portion 335 when the optical member M2 and the panel member M1 come in close contact with each other to be bonded together.

Figure 7:
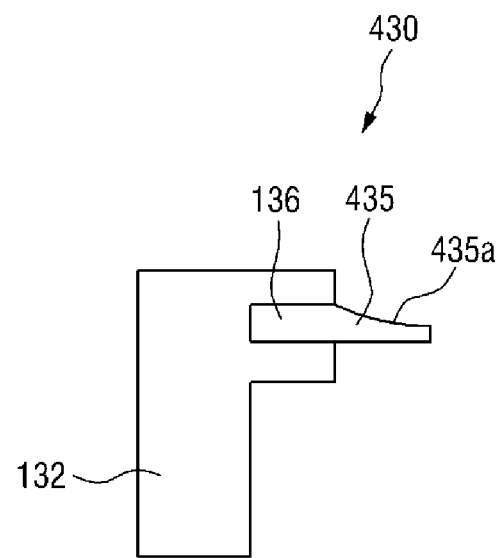
Figure 8:
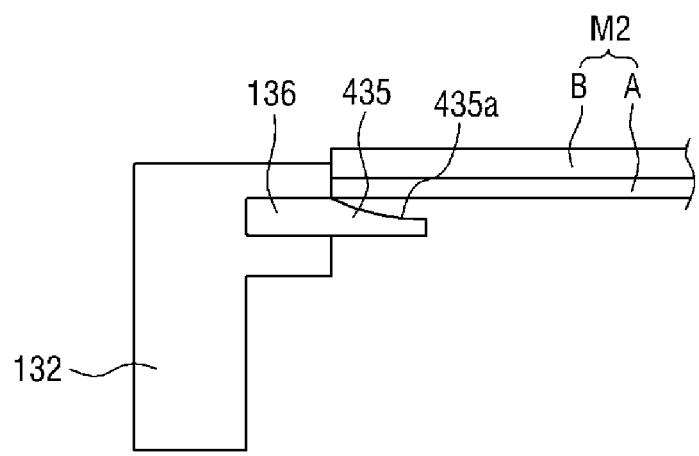

FIG. 7 exemplifies that a support member 430 may include a movement portion 132, a contact portion 435, and a connection portion 136, and the thickness of the contact portion 435 becomes thinner as going from the outside to the inside of the chuck 120 shown in FIG. 1. The upper surface 435a of the contact portion 435 may be a curved surface that is inclined and may be downwardly concave. As illustrated in FIG. 8, by reducing the attachment area between the contact portion 435 and the optical member M2, the support member 430 may facilitate and smooth the detachment of the contact portion 435 when the optical member M2 and the panel member M1 come in close contact with each other to be bonded together. The support member 430 may enable the optical member M2 to naturally come in close contact with the panel member M1 through the contact portion 435 having the concave curved surface.

Figure 9:
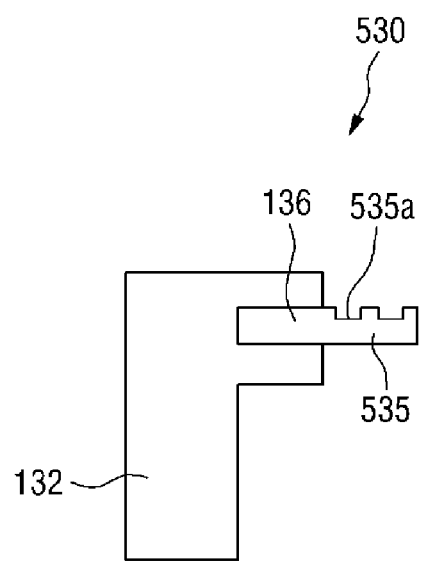
Figure 10:
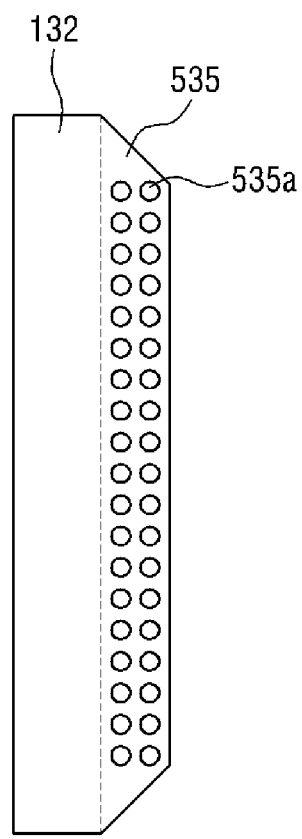
Figure 11:
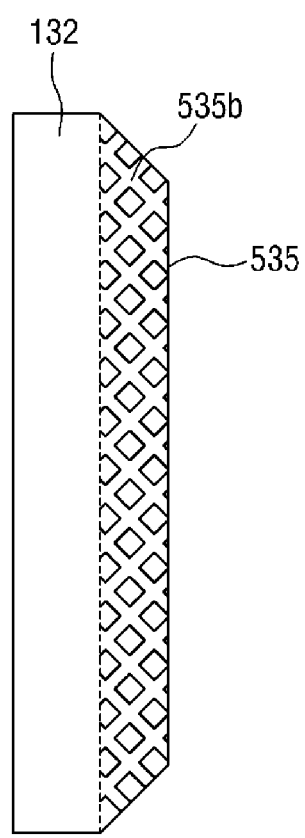
Figure 12:
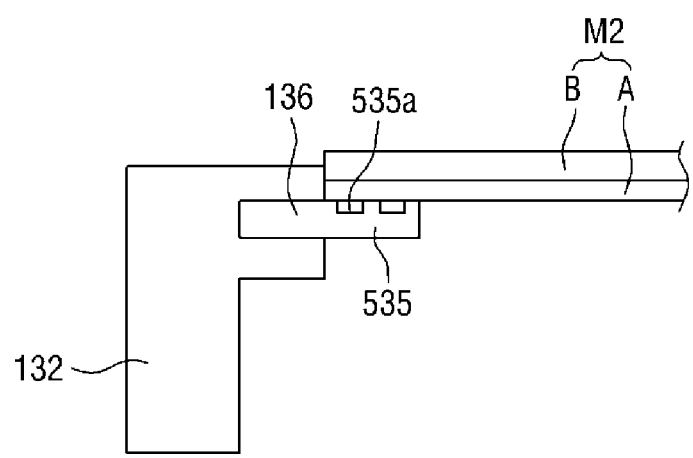

FIG. 9 illustrates that a support member 530 may include a movement portion 132, a contact portion 535, and a connection portion 136, and the contact portion 535 may include grooves 535a formed on the upper surface. As illustrated in FIG. 10, the grooves 535a may be arranged to be spaced apart from each other along predetermined lines. As illustrated in FIG. 11, the contact portion 535 may include lattice type grooves 535b. As illustrated in FIG. 12, by reducing the attachment force through heightening a frictional force between the contact portion 535 and the optical member M2, the support member 530 may facilitate and smooth detachment of the contact portion 535 when the optical member M2 and the panel member M1 come in close contact with each other to be bonded together due to the difference between the second pressure on the outside of the optical member M2 and the first pressure between the optical member M2 and the panel member M1.

Figure 13:
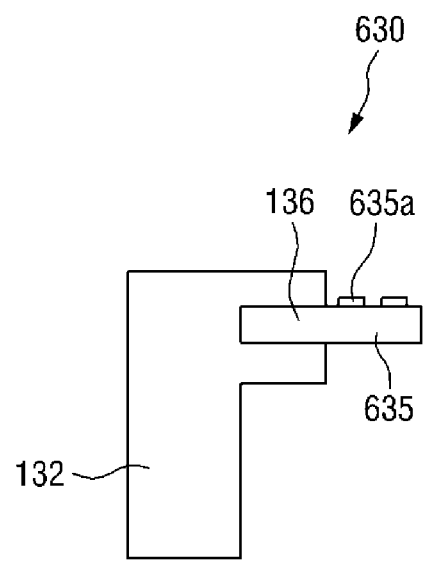
Figure 14:
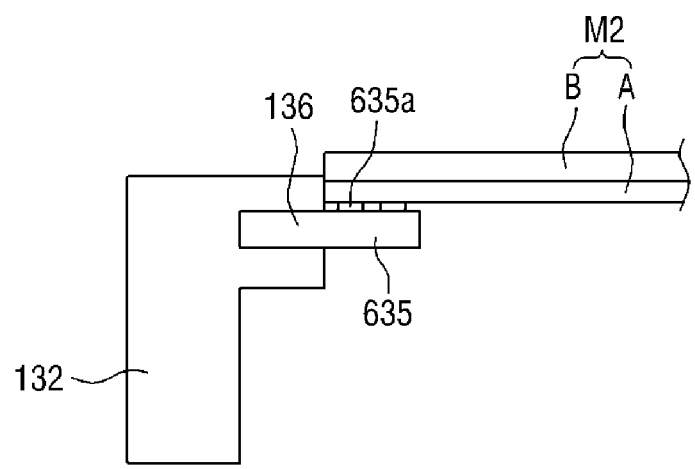

FIG. 13 illustrates that a support member 630 may include a movement portion 132, a contact portion 635, and a connection portion 136, and the contact portion 635 may include projections 635a formed on the upper surface. The projections 635a may be arranged in the same pattern as the pattern of the grooves 535a illustrated in FIG. 10. As illustrated in FIG. 14, by reducing the attachment force through heightening, a frictional force between the contact portion 635 and the optical member M2 through the projections 635a, the support member 630 may facilitate and smooth the detachment of the contact portion 635 when the optical member M2 and the panel member M1 come in close contact with each other to be bonded together.

Figure 15:
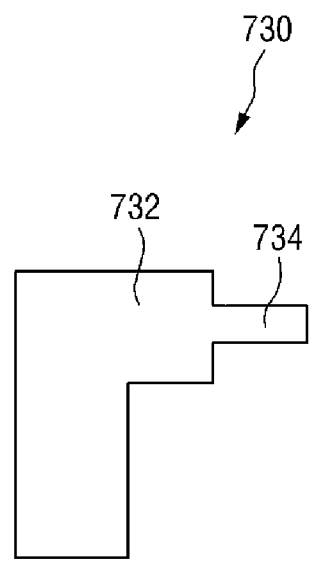
Figure 16:
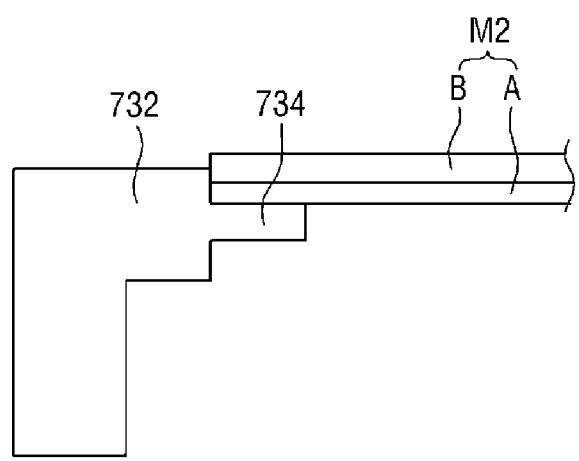

FIG. 15 illustrates that a support member 730 may include a movement portion 732 and a contact portion 734 that may be integrally formed. The support member 730 may be similar to the support member 130 of FIG. 1, and may support the optical member M2 through the contact portion 734 as shown in FIG. 16. Since the support member 730 may include the movement portion 732 and the contact portion 734 that are integrally formed, it may be simply formed without any separate assembling process. The movement portion 732 and the contact portion 734 may be formed of a material that does not generate static electricity with the adhesive layer A of the optical member M2, for example, silicon or Teflon™.

Figure 17:
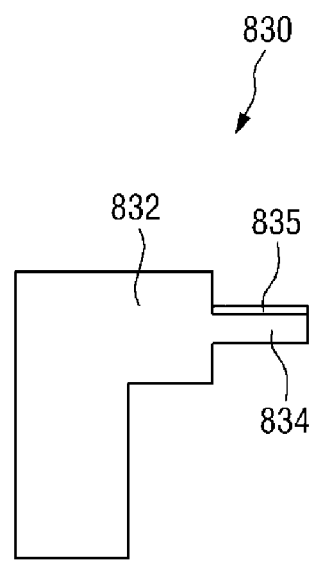
Figure 18:
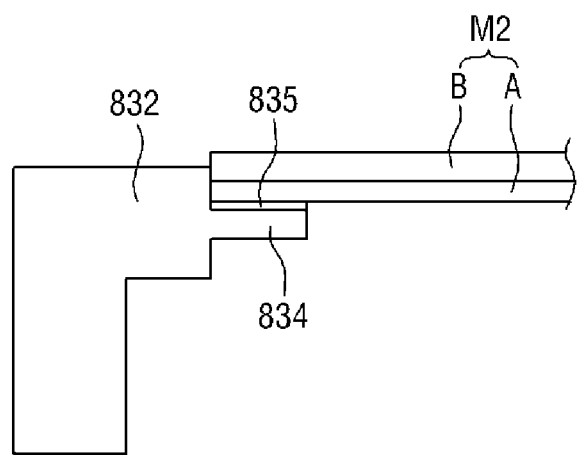

FIG. 17 illustrates that a support member 830 may include a movement portion 832 and a contact portion 834 that may be integrally formed, and a coating layer 835 formed on the contact portion 834. The movement portion 832 and the contact portion 834 may be formed of a stainless steel material having durability, and the coating layer 835 may be formed of a material that does not generate static electricity, for example, silicon or Teflon™. The support member 830 may be similar to the support member 130 of FIG. 1, and may enable the optical member M2 to be attached to the coating layer 835 with durability without being affected by the static electricity through the movement portion 832 and the contact portion 834 as illustrated in FIG. 18.

Figure 19:
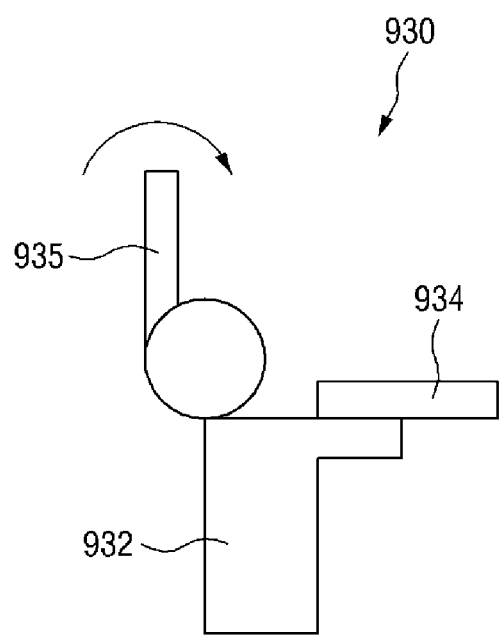
Figure 20:
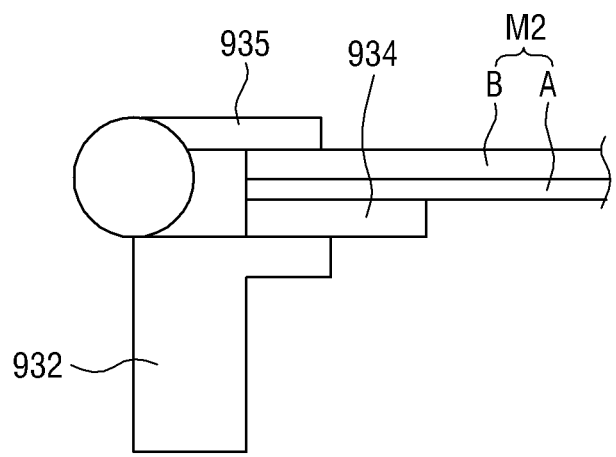

FIG. 19 illustrates that a support member 930 may include a movement portion 932, a contact portion 934, and a rotatable holding portion 935. The support member 930 may be similar to the support member 130 of FIG. 1, and may make it possible to adjust a tension of the optical member M2 in a state where the optical member M2 is firmly fixed by attaching the optical member M2 on the contact portion 934 and fixing the optical member M2 through the holding portion 935 as illustrated in FIG. 20.

Figure 21:
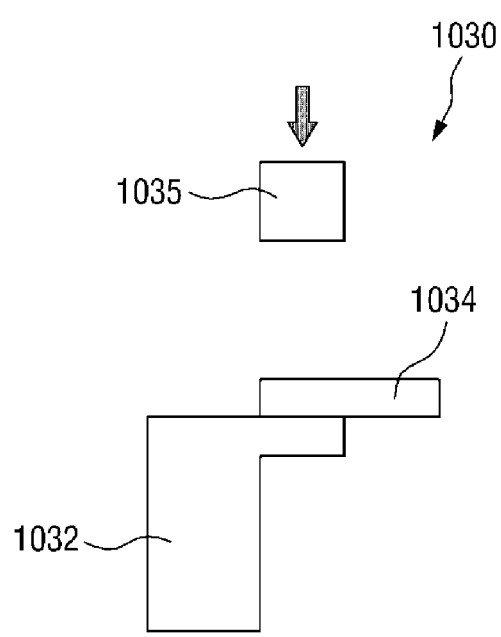
Figure 22:
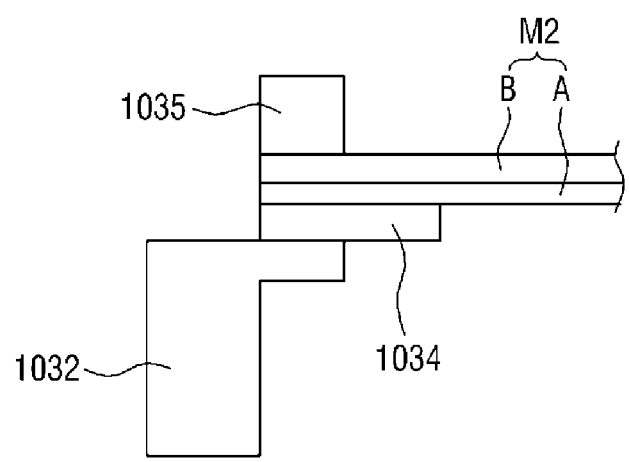

FIG. 21 illustrates that a support member 1030 may include a movement portion 1032, a contact portion 1034, and a holding portion 1035 having magnetism. The support member 1030 may be similar to the support member 130 of FIG. 1, and may make it possible to fix the optical member M2 through the holding portion 1035 having magnetism after the optical member M2 is attached to the contact portion 1034 as illustrated in FIG. 22. For example, the movement portion 1032 may be formed of a material that may form magnetic force with the holding portion 1035.

A method for manufacturing a display device using a bonding apparatus 100 according to exemplary embodiments of the present invention will be described.

FIGS. 23 through 28 are cross-sectional views explaining processes of a method for manufacturing a display device using a bonding apparatus.

Figure 23:
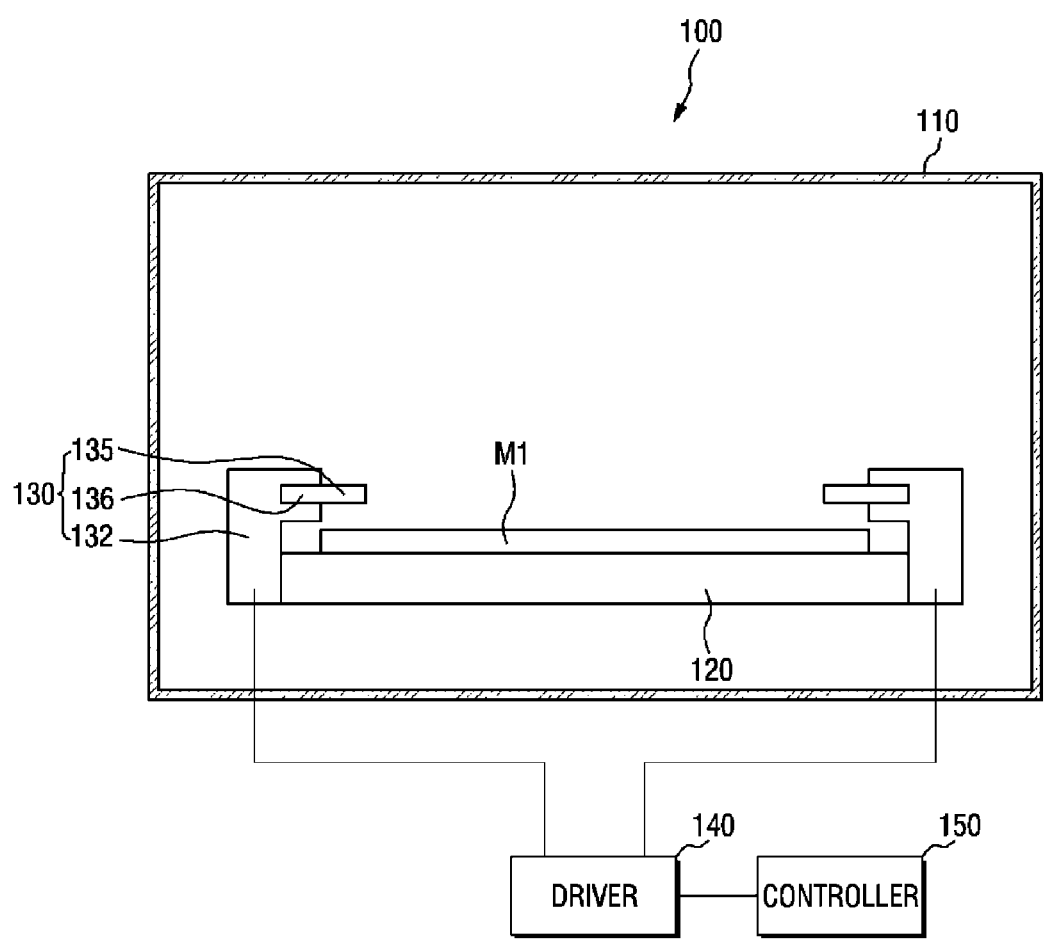
FIGS. 23 through 28 are cross-sectional views explaining processes of manufacturing a display device using a bonding apparatus according to exemplary embodiments of the present invention.

Referring to FIG. 23, a movement portion 132, which may be connected to a contact portion 135 so that the contact portion 135 overlaps an edge portion of a panel member M1 that is seated on a chuck 120 arranged inside a chamber 110, and may move horizontally and vertically, may be arranged on a side portion of the chuck 120. The contact portion 135 may be arranged on the edge portion of the panel member M1 to be spaced apart. On the other hand, in the case where the contact portion 135 does not overlap the panel member M1 even though the movement portion 132 is arranged on the side portion of the chuck 120, the movement portion 132 may perform horizontal movement or vertical movement to make the contact portion 135 overlap the edge portion of the panel member M1.

The panel member M1 may include a substrate for a display of a display device, such as an organic light emitting display device or a liquid crystal display device. The substrate for a display may be a bare substrate or a substrate in which switching elements are formed. In the case of the organic light emitting display device, the substrate for a display may be a substrate in which switching elements and a light emitting layer are formed.

The panel member M1 may be a display panel that may include two substrates which are bonded through the medium of a light emitting layer or a liquid crystal layer. The substrate may be a glass substrate or a flexible substrate that is formed of plastic, for example, polyethyleneterephthalate, polyethylenenaphthalate, polycarbonate, polyarylate, polyetherimide, polyethersulfone, or polyimide. The flexible substrate may be provided as a flexible film.

Figure 24:
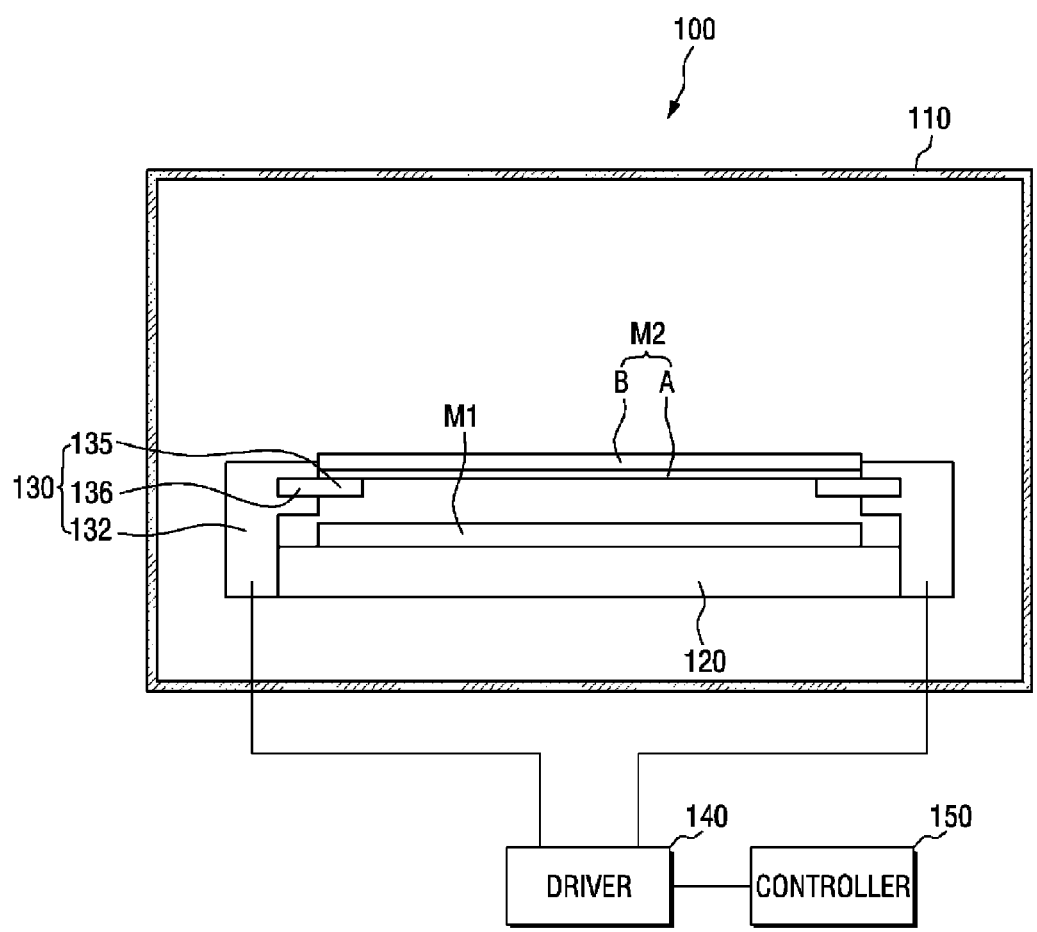

Referring to FIG. 24, the edge portion of the optical member M2 that is drawn into the inner space of the chamber 110 may be attached to the contact portion 135. The optical member M2 may include a base film layer B and an adhesive layer A that may be formed on the base film layer B. The adhesive layer A of the optical member M2 may be covered by a release paper before the optical member M2 is drawn into the inner space of the chamber 110.

The optical member M2 may be a film having an optical function. For example, if the panel member M1 of the display device is a substrate for a display in which switching elements are formed, the optical member M2 may be a protection film that protects the panel member M1. The protection film may be temporarily attached to the panel member M1 in the process of manufacturing a display device, and may be separated from the panel member M1 in the completed display device. In the case where the panel member M1 is a substrate for a display in which switching elements and a light emitting layer are formed, the optical member M2 may be an encapsulation film that encapsulates the switching elements and the light emitting layer. In the case where the panel member M1 is a display panel that includes two substrates which are bonded through the medium of the light emitting layer or the liquid crystal layer, the optical member M2 may be a polarizing film or an OCA (Optical Clear Adhesive) film. The optical member M2 may include a base film layer B that may be formed of polyimide or polyethyleneterephthalate and an adhesive layer A that may be formed of thermosetting resin, such as acrylic resin, on the base film layer B. The base film layer B may further include configurations for implementing the optical function.

Although not illustrated, the optical member M2 may be drawn into the inner space of the chamber 110 in a state where it may be fixed to a separate chuck, and after the optical member M2 is attached to the contact portion 135, the separate chuck may be separated from the optical member M2 to be discharged out of the chamber 110.

Referring to FIG. 25, the tension of the optical member M2 may be adjusted by horizontally moving the movement portion 132. Accordingly, the optical member M2 may be maintained to be flat.

Referring to FIG. 26, a first pressure may be formed by making the inner space of the chamber 110 in a vacuum state, and the contact portion 135 may be made to come in contact with the edge portion of the panel member M1 by vertically moving the movement portion 132. The vacuum state may be formed by discharging air out of the inner space of the chamber 110 using a vacuum pump (not illustrated) under the control of the controller 150. The vertical movement of the movement portion 132 may be performed by the driver 140 that is controlled by the controller 150.

Referring to FIG. 27, a second pressure that may be higher than the first pressure may be formed in the chamber 110 by making the outside of the optical member M2 in an atmospheric state through ventilation of the chamber 110, and thus the panel member M1 may come in close contact with the optical member M2 due to the difference between the second pressure on the outside of the optical member M2 and the first pressure between the optical member M2 and the panel member M1. The ventilation of the chamber 110 may be performed by injecting air into the inner space of the chamber 110 using a vent means (not illustrated) under the control of the controller 150.

Figure 28:
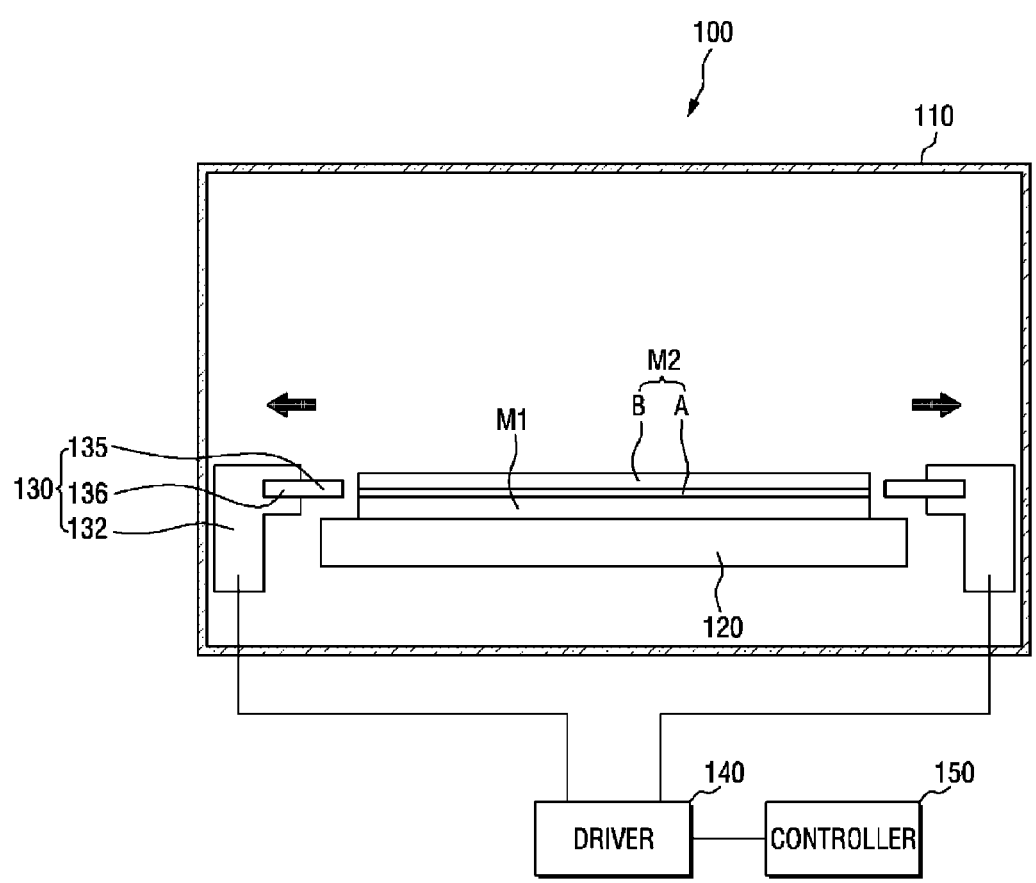

Referring to FIG. 28, the contact portion 135 may be detached from the edge portion of the panel member M1 and the edge portion of the optical member M2 by horizontally moving the movement portion 132. Accordingly, the edge portion of the panel member M1 and the edge portion of the optical member M2 may come in close contact with each other to complete the bonding of the panel member M1 to the optical member M2. The horizontal movement of the movement portion 132 may be performed by the driver 140 that is controlled by the controller 150.

The bonding of the panel member M1 to the optical member M2 as described above may be bonding of a protection film to the substrate for a display. The bonding of the panel member M1 to the optical member M2 may be bonding of an encapsulation film to the substrate for a display on which switching elements and a light emitting layer may be formed. The bonding of the panel member M1 to the optical member M2 may be bonding of a polarizing film to a display panel that may include two substrates bonded together by the medium of the light emitting layer or the liquid crystal layer. The bonding of the panel member M1 to the optical member M2 may be bonding of an OCA (Optical Clear Adhesive) film to the display panel. In this case, a window may be attached onto the OCA film. Through the bonding of the panel member M1 and the optical member M2, a display device may be manufactured.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a display device, comprising:
    arranging a movement portion of a support member on a side portion of a chuck arranged in an inner space of a chamber to have a contact portion of the support member overlap an edge portion of a panel member sitting on the chuck;
    attaching an edge portion of an optical member to the contact portion to face the panel member;
    forming a first pressure to have the contact portion contact with the edge portion of the panel member by moving the movement portion vertically;
    forming a second pressure that is higher than the first pressure to have the panel member and the optical member contact with each other due to a difference between the second pressure on the outside of the optical member and the first pressure between the optical member and the panel member; and
    detaching the contact portion from the edge portion of the panel member and the edge portion of the optical member by moving the movement portion horizontally
    wherein the movement portion is connected to a contact portion of the support member and horizontally and vertically movable.
2. The method of claim 1, further comprising:
    adjusting a tension of the optical member through horizontally moving the movement portion after attaching the edge portion of the optical member to the contact portion.
3. The method of claim 1, wherein:
    a plurality of support members are provided, and
    the movement portions of the support members are independently driven.
4. The method of claim 3, wherein:
    the optical member is rectangular,
    the plurality of support members are divided along sides of the optical member and correspond to the sides of the optical member, and
    the contact portion of each of the respective support members has a width that becomes narrower as going inward.
5. The method of claim 1, wherein:
    the panel member is a substrate for a display on which switching elements are disposed, and
    the optical member is a protection film.
6. The method of claim 1, wherein:
    the panel member is a substrate for a display on which switching elements and a light emitting layer are formed, and
    the optical member is an encapsulation film that encapsulates the switching elements and the light emitting layer.
7. The method of claim 1, wherein:
    the panel member is one of an organic light emitting display substrate and a liquid crystal display substrate, and
    the optical member is one of an optical clear adhesive (OCA) film and a polarizing film.
8. The method of claim 1, wherein the support member further comprises:
    a connection portion,
    wherein the connection portion is bonded to the movement portion and integrally formed with the contact portion.
9. The method of claim 1, wherein the contact portion includes a groove or a projection formed on its upper surface.
10. The method of claim 1, wherein the movement portion and the contact portion are integrally formed with each other.
11. The method of claim 1, wherein the optical member comprises:
    a base film layer; and
    an adhesive layer arranged on the base film layer,
    wherein the adhesive layer faces the panel member and is formed of thermosetting resin, and
    wherein the contact portion is formed of silicon or Teflon™.
12. The method of claim 10, wherein the support member further comprises a coating layer disposed on an upper surface of the contact portion.
13. The method of claim 12, wherein the optical member comprises:
    a base film layer; and
    an adhesive layer arranged on the base film layer,
    wherein the adhesive layer faces the panel member and is formed of thermosetting resin, and
    the contact portion is formed of silicon or Teflon™.
14. The method of claim 1, wherein:
    the contact portion is connected to an upper surface of the movement portion, and
    the support member further comprises a holding portion that is rotatably coupled on one side of the contact portion on the upper surface of the movement portion.
15. The method of claim 1, wherein:
    the contact portion is connected to an upper surface of the movement portion, and
    the support member further comprises a holding portion which is magnetic and arranged on an upper portion of the contact portion to be vertically movable to fix the optical member via magnetic field formed by the holding portion and the contact portion.
16. A method of bonding in a vacuum chamber, comprising:
    placing a first member in a vacuum chamber;
    placing a second member over the first member;
    aligning the first member and the second member;

lowering pressure in the vacuum chamber to form a lower pressure between the first member and the second member;

heightening pressure in the vacuum chamber to form a higher ambient pressure other than the lower pressure between the first member and the second member; and bonding the first member and the second member due to difference between the lower pressure and the higher ambient pressure.

17. The method of claim 16, wherein the second member has an adhesive layer.

18. The method of claim 16, wherein the second member moves closer to the first member as the pressure in the vacuum chamber is increasing.

19. The method of claim 17, wherein:
the first member is a display substrate, and
the second member is an optical film.

20. The method of claim 19, wherein the display substrate is one of an organic light emitting display substrate and a liquid crystal display substrate.

\* \* \* \* \*